(12) United States Patent
Jeon

(10) Patent No.: US 11,621,398 B2
(45) Date of Patent: Apr. 4, 2023

(54) FOLDABLE DISPLAY DEVICE

(71) Applicant: Samsung Display Co., Ltd., Yongin-Si (KR)

(72) Inventor: Heechul Jeon, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/520,817

(22) Filed: Jul. 24, 2019

(65) Prior Publication Data

US 2020/0119291 A1 Apr. 16, 2020

(30) Foreign Application Priority Data

Oct. 11, 2018 (KR) .................. 10-2018-0121121

(51) Int. Cl.
*G06F 1/16* (2006.01)
*H01L 51/00* (2006.01)
(Continued)

(52) U.S. Cl.
CPC ...... *H01L 51/0097* (2013.01); *H01L 51/5253* (2013.01); *H01L 27/3244* (2013.01); *H01L 2251/5338* (2013.01)

(58) Field of Classification Search
CPC ............. H01L 51/0097; H01L 51/5253; H01L 27/3244; H01L 2251/5338; H05K 7/142;
(Continued)

(56) References Cited

U.S. PATENT DOCUMENTS 9,348,369 B2 * 5/2016 Kee ..................... G06F 1/1641
9,535,522 B2 1/2017 Ahn
(Continued)

FOREIGN PATENT DOCUMENTS

| CN | 104347007 A | 2/2015 |
|----|-------------|--------|
| CN | 107885381 A | 4/2018 |
| CN | 107978626 A | 5/2018 |
| CN | 108953864 A | 12/2018 |
| GB | 2502305 A | 11/2013 |

(Continued)

OTHER PUBLICATIONS

Matweb, Overview of materials for Thermoplastic Polyurethane, Obtained from internet Apr. 7, 2021, http://www.matweb.com/search/DataSheet.aspx?MatGUID=3167151b78184dd2b30fe6c465992565 (Year: 2021).*

(Continued)

*Primary Examiner* — Abhishek M Rathod
*Assistant Examiner* — Keith De Pew
(74) *Attorney, Agent, or Firm* — Cantor Colburn LLP

(57) ABSTRACT

A foldable display device includes a display module including a folding area, which is folded with respect to a folding axis, and a first non-folding area and a second non-folding area, which are spaced apart from each other with the folding area therebetween, a protection member including a first protection plate disposed on the first non-folding area and a second protection plate disposed on the second non-folding area, an adhesion member including a first adhesion portion disposed between the first non-folding area and the first protection plate and a second adhesion portion disposed between the second non-folding area and the second protection plate, and a reinforcing member disposed on the folding area and provided in a same layer as the first adhesion portion and the second adhesion portion. Here, the reinforcing member contacts each of the first adhesion portion and the second adhesion portion.

20 Claims, 13 Drawing Sheets

(51) Int. Cl.
*H01L 51/52* (2006.01)
*H01L 27/32* (2006.01)

(58) Field of Classification Search
CPC ........ H05K 3/301; H05K 3/325; G06F 1/184; G06F 1/185
See application file for complete search history.

(56) References Cited

U.S. PATENT DOCUMENTS

| | | | |
|---|---|---|---|
| 9,939,847 B2* | 4/2018 | Kee | G06F 1/1652 |
| 10,032,847 B2 | 7/2018 | Jeon | |
| 10,331,173 B2* | 6/2019 | Cho | G09F 9/301 |
| 10,362,696 B2* | 7/2019 | Ahn | H05K 5/0226 |
| 10,429,895 B2* | 10/2019 | Lee | G06F 1/1641 |
| 10,440,817 B2 | 10/2019 | Choi et al. | |
| 10,444,797 B2* | 10/2019 | Kee | G06F 1/1616 |
| 10,534,400 B2* | 1/2020 | Wu | G06F 1/1618 |
| 10,540,030 B2 | 1/2020 | Kim et al. | |
| 10,585,457 B2* | 3/2020 | Park | G06F 1/1652 |
| 10,620,668 B2* | 4/2020 | Park | G06F 1/1681 |
| 10,665,823 B2* | 5/2020 | Kim | H01L 23/552 |
| 10,674,617 B2* | 6/2020 | Lin | B32B 7/12 |
| 10,698,446 B2* | 6/2020 | Kim | G06F 3/04886 |
| 2014/0355195 A1* | 12/2014 | Kee | H04M 1/0268 361/679.27 |
| 2015/0036269 A1 | 2/2015 | Kim et al. | |
| 2016/0338219 A1 | 11/2016 | Seo et al. | |
| 2017/0062742 A1 | 3/2017 | Kim | |
| 2017/0170417 A1 | 6/2017 | Myung et al. | |
| 2017/0192462 A1* | 7/2017 | Kim | G06F 1/1643 |
| 2017/0263887 A1 | 9/2017 | Han et al. | |
| 2018/0090698 A1 | 3/2018 | Jeong et al. | |
| 2018/0102496 A1* | 4/2018 | Kim | H05K 5/0017 |
| 2018/0107250 A1* | 4/2018 | Cho | H01L 51/0097 |
| 2018/0175311 A1* | 6/2018 | Jin | H01L 27/3258 |
| 2018/0197935 A1* | 7/2018 | Yuan | H01L 51/0097 |
| 2018/0343756 A1* | 11/2018 | Lin | G02F 1/16753 |
| 2019/0012028 A1* | 1/2019 | Park | G06F 1/1641 |
| 2019/0061318 A1* | 2/2019 | Jung | G06F 3/041 |
| 2019/0086962 A1* | 3/2019 | Shin | G06F 1/1652 |
| 2019/0173030 A1* | 6/2019 | Kim | B32B 7/12 |
| 2019/0204872 A1* | 7/2019 | Lee | G06F 1/1652 |
| 2019/0305238 A1* | 10/2019 | Shin | H01L 27/3244 |
| 2019/0346887 A1* | 11/2019 | Park | G09F 9/301 |
| 2019/0361494 A1* | 11/2019 | Wu | H04M 1/0214 |
| 2019/0363290 A1 | 11/2019 | Watanabe | |
| 2019/0377383 A1* | 12/2019 | Kim | G06F 1/1616 |
| 2020/0183457 A1* | 6/2020 | Youn | G06F 1/1652 |

FOREIGN PATENT DOCUMENTS

| | | |
|---|---|---|
| KR | 1020160089583 A | 7/2016 |
| KR | 1020160133053 A | 11/2016 |
| KR | 1020170064453 A | 6/2017 |
| KR | 1020170070309 A | 6/2017 |
| KR | 1020170113870 A | 10/2017 |
| KR | 1020180034156 A | 4/2018 |
| KR | 1020180034780 A | 4/2018 |
| KR | 1020180043441 A | 4/2018 |
| KR | 1020190141041 A | 12/2019 |
| WO | 2018179213 A1 | 10/2018 |

OTHER PUBLICATIONS

Weibin, et al., OLED, Research Progress of Bonding Materials for OLED Encapsulation Application, www.gdchem.com, (2018), 3 Pages.

* cited by examiner

FOLDABLE DISPLAY DEVICE

This application claims priority to Korean Patent Application No. 10-2018-0121121, filed on Oct. 11, 2018, and all the benefits accruing therefrom under 35 U.S.C. § 119, the content of which in its entirety is herein incorporated by reference.

BACKGROUND

1. Field

Exemplary embodiments of the invention herein relate to a display device, and more particularly, a foldable display device capable of being folded.

2. Description of Related Art

Various kinds of display devices, which are used for multimedia devices, such as a television, a mobile phone, a tablet computer, a navigation unit, and a game console, are being developed. The display devices generally include a keyboard or a mouse, for example, as an input unit. Also, in recent years, the display devices include an input sensing unit as the input unit.

In recent years, unlike a typical display device, various types of display devices are being developed. Various flexible display devices such as a curved display device, a bending-type display device, a foldable display device, a rollable display device, and a stretchable display device have been developed. In particular, the foldable display device capable of being folded with respect to a folding axis is being developed.

SUMMARY

Exemplary embodiments of the invention provide a foldable display device that is easily folded and improves in visibility.

An exemplary embodiment of the invention provides a foldable display device including a display module including a folding area, which is folded with respect to a folding axis, and a first non-folding area and a second non-folding area, which are spaced apart from each other with the folding area therebetween, a protection member including a first protection plate disposed on the first non-folding area and a second protection plate disposed on the second non-folding area, an adhesion member including a first adhesion portion disposed between the first non-folding area and the first protection plate and a second adhesion portion disposed between the second non-folding area and the second protection plate, and a reinforcing member disposed on the folding area and provided in a same layer as the first adhesion portion and the second adhesion portion. Here, the reinforcing member contacts each of the first adhesion portion and the second adhesion portion.

In an exemplary embodiment, the reinforcing member may have the same thickness.

In an exemplary embodiment, the reinforcing member, the first adhesion portion, and the second adhesion portion may have the same thickness as each other.

In an exemplary embodiment, the first adhesion portion may be disposed on a first area of the first non-folding area, and the second adhesion portion may be disposed on a first area of the second non-folding area.

In an exemplary embodiment, the reinforcing member may include a central portion disposed on the folding area, a first portion disposed between a second area of the first non-folding area and the first protection plate, and a second portion disposed between a second area of the second non-folding area and the second protection plate.

In an exemplary embodiment, the first adhesion portion may contact the first area of the first non-folding area, the first protection plate, and the first portion, and the second adhesion portion may contact the first area of the second non-folding area, the second protection plate, and the second portion.

In an exemplary embodiment, when the display module is folded along the folding axis, the first portion and the second portion may face each other in a thickness direction of the display module.

In an exemplary embodiment, the central portion may have a thickness less than that of each of the first portion and the second portion.

In an exemplary embodiment, the first portion and the second portion may have the same thickness as each other.

In an exemplary embodiment, the reinforcing member may not overlap each of the first non-folding area and the second non-folding area.

In an exemplary embodiment, the reinforcing member may have a thickness less than that of each of the first adhesion portion and the second adhesion portion.

In an exemplary embodiment, the reinforcing member may have a modulus equal to or greater than 500 megapascals (MPa) and equal to or less than 1200 MPa.

In an exemplary embodiment, the reinforcing member may include at least one of an acrylic-based polymer, a silicon-based polymer, and an imide-based polymer.

In an exemplary embodiment, the display module may include a display panel disposed on the protection member and the reinforcing member through the adhesion member, and an input sensing unit disposed on the display panel.

In an exemplary embodiment of the invention, a foldable display device includes a display module including a folding area, which is folded with respect to a folding axis, and a first non-folding area and a second non-folding area, which are spaced apart from each other with the folding area therebetween, a protection member disposed on the display module, an adhesion member including a first adhesion portion disposed between a first area of the first non-folding area and the protection member and a second adhesion portion disposed between a first area of the second non-folding area and the protection member, and a reinforcing member disposed on the folding area and provided in a same layer as the first adhesion portion and the second adhesion portion. Here, the reinforcing member contacts each of the first adhesion portion and the second adhesion portion.

In an exemplary embodiment, the reinforcing member may include a central portion disposed between the folding area and the protection member, a first portion disposed between a second area of the first non-folding area and the protection member, and a second portion disposed between a second area of the second non-folding area and the protection member, and the central portion, the first portion, and the second portion may be unitary with each other.

In an exemplary embodiment, the central portion may have a thickness less than that of each of the first portion and the second portion.

In an exemplary embodiment, the first adhesion portion may contact the display module, the protection member, and the first portion, and the second adhesion portion may contact the display module, the protection member, and the second portion.

In an exemplary embodiment, the reinforcing member may include a flexible material.

In an exemplary embodiment of the invention, a foldable display device may include a display module including a folding area, which is folded with respect to a folding axis, and a non-folding area, which is disposed adjacent to the folding area, a protection member disposed on the non-folding area, an adhesion member disposed between the non-folding area and the protection member, and a reinforcing member disposed on the folding area and provided in a same layer as the adhesion member. Here, the reinforcing member may contact the adhesion member.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
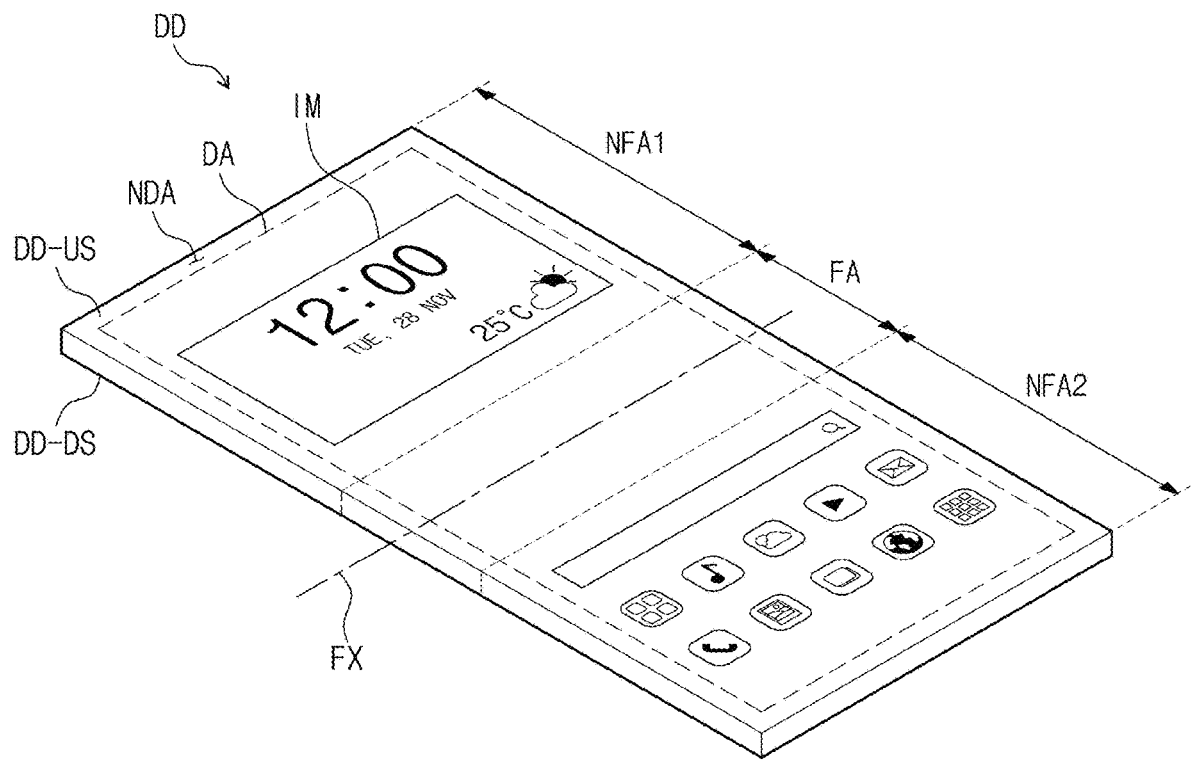
FIG. 1 is a perspective view illustrating an exemplary embodiment of a display device according to the invention.
Figure 1:
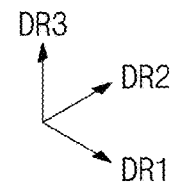

In this specification, it will be understood that when an element such as a region, layer, or portion is referred to as being "on" another element, it can be directly on the other element or intervening elements may also be present.

Like reference numerals refer to like elements throughout. Also, in the drawings, the thicknesses, ratios, and dimensions of components are exaggerated for clarity of illustration.

As used herein, the term "and/or" includes any and all combinations of one or more of the associated listed items.

It will be understood that although the terms of first and second are used herein to describe various elements, these elements should not be limited by these terms. The terms are only used to distinguish one component from other components. For example, a first element referred to as a first element in one embodiment can be referred to as a second element in another exemplary embodiment. The terms of a singular form may include plural forms unless referred to the contrary.

Also, spatially relative terms, such as "below", "lower", "above", and "upper", may be used herein for ease of description to describe an element and/or a feature's relationship to another element(s) and/or feature(s) as illustrated in the drawings. The terms are relative concepts and described with respect to the direction indicated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a region, a fixed number, a step, a process, an element and/or a component but does not exclude other properties, regions, fixed numbers, steps, processes, elements and/or components.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described with reference to the accompanying drawings.

Figure 2A:
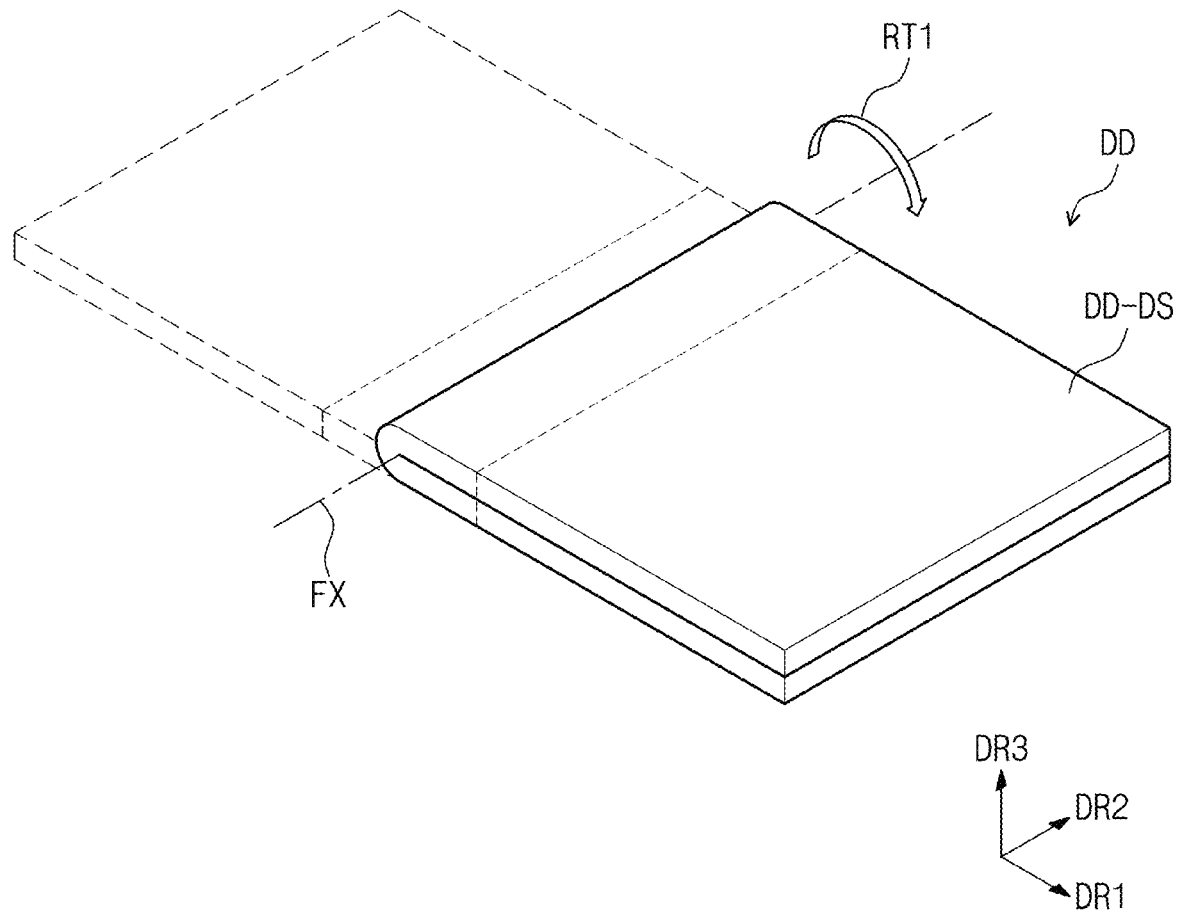
FIG. 2A is a perspective view illustrating an exemplary embodiment of the display device that is folded with respect to a folding axis according to the invention.
Figure 2B:
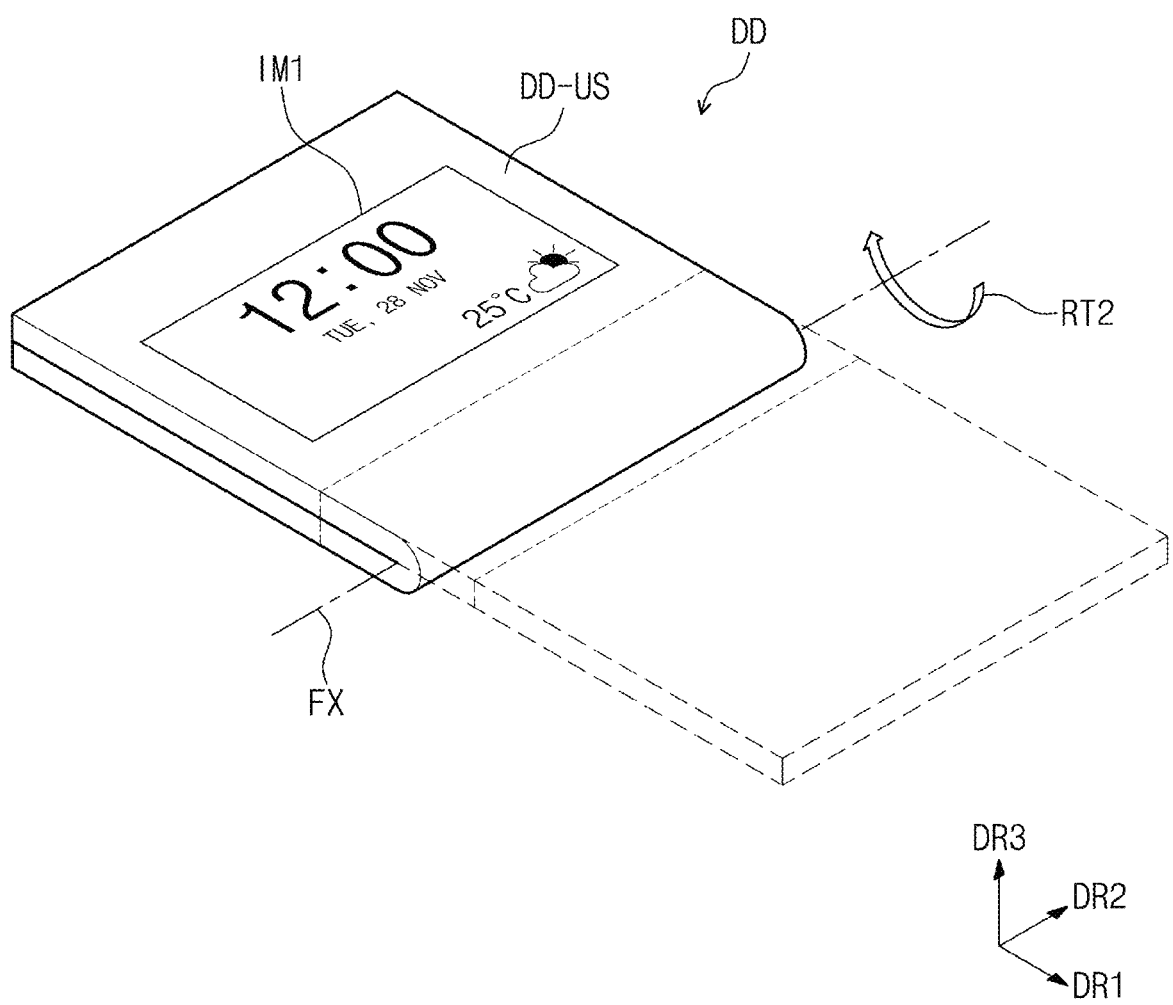
FIG. 2B is a perspective view illustrating an exemplary embodiment of the display device that is folded with respect to the folding axis according to the invention.

FIG. 1 is a perspective view illustrating an exemplary embodiment of a display device according to the invention. FIG. 2A is a perspective view illustrating an exemplary embodiment of the display device that is folded with respect to a folding axis according to the invention. FIG. 2B is a perspective view illustrating an exemplary embodiment of the display device that is folded with respect to the folding axis according to the invention.

In an exemplary embodiment of the invention, although a foldable display device DD (hereinafter, also referred to as a display device) is exemplarily illustrated, the invention is not limited thereto. In an exemplary embodiment, embodiments of the invention may be applied to various display devices such as a curved display device, a bending-type display device, a rollable display device, and a stretchable display device. Also, an exemplary embodiment of the foldable display device DD according to an the invention may be used for a large-sized electronic device such as a television or an outdoor advertisement board as well as a small and medium-sized electronic device such as a mobile phone, a personal computer, a notebook computer, a personal digital terminal, a vehicle navigation unit, a game console, a portable electronic device, a wrist watch-type electronic device, and a camera.

Referring to FIG. 1, the display device DD includes a plurality of areas that are divided on a display surface. The display surface may be divided into a display area DA and a non-display area NDA on the basis of whether an image IM is displayed. The display area DA is an area on which an image is displayed, and the non-display area NDA is an area disposed adjacent to the display area DA and on which the image is not displayed. In an exemplary embodiment, the display device DD in FIG. 1 is provided as a rectangular shaped smartphone and displays the image IM indicating weather information and icons, for example. The non-display area NDA may be disposed adjacent to the display area DA or surround the display area DA. In another exemplary embodiment, the non-display area NDA may be omitted.

Here, the display surface is parallel to a surface defined by a first direction DR1 and a second direction DR2. A normal direction of the display surface indicates a third direction DR3. The third direction DR3 indicates a thickness direction of the display device DD. Front and rear surfaces of each of the members are distinguished by the third direction DR3. However, directions indicated by the directions DR1, DR2, and DR3 may be a relative concept and converted with respect to each other.

In an exemplary embodiment of the invention, the display device DD may include a folding area FA that is folded along a folding axis FX, a first non-folding area NFA1 and a second non-folding area NFA2, which are spaced apart from each other with the folding area FA therebetween. The folding axis FX may have the same direction as the second direction DR2. In the first direction DR1, the first non-folding area NFA1 extends from one end of the folding area FA, and the second non-folding area NFA2 extends from the other end of the folding area FA.

A top surface DD-US of the display device DD may include a first display surface overlapping the folding area FA, a second display surface overlapping the first non-folding area NFA1, and a third display surface overlapping the second non-folding area NFA2. A bottom surface DD-DS of the display device DD may be opposite to the top surface DD-US. Each of the first to third display surfaces may display an image.

In particular, an exemplary embodiment of the display device DD according to the invention may be folded in both directions with respect to the folding axis FX.

Referring to FIG. 2A, the folding area FA (refer to FIG. 1) may be folded along the folding axis FX so that the second display surface faces the third display surface. In this case, the folding area FA may be folded along a first rotation axis RT1, and the bottom surface DD-DS of the display device DD may be exposed to the outside. The first rotation axis RT1 may have a clockwise direction.

Referring to FIG. 2B, the folding area FA (refer to FIG. 1) may be folded along the folding axis FX so that the second display surface and the third display surface are exposed to the outside. In this case, the folding area FA may be folded along a second rotation axis RT2, and the top surface DD-US of the display device DD may be exposed to the outside. The second rotation axis RT2 may have a counter-clockwise direction.

As described above, the display device DD may be folded along the folding axis FX so that the second display surface of the first non-folding area NFA1 faces the third display surface of the second non-folding area NFA2, which is defined as an inner folding. As described above, the display device DD may be folded along the folding axis FX so that the second display surface of the first non-folding area NFA1 and the third display surface of the second non-folding area NFA2 face the outside, which is defined as an outer folding.

Figure 3:
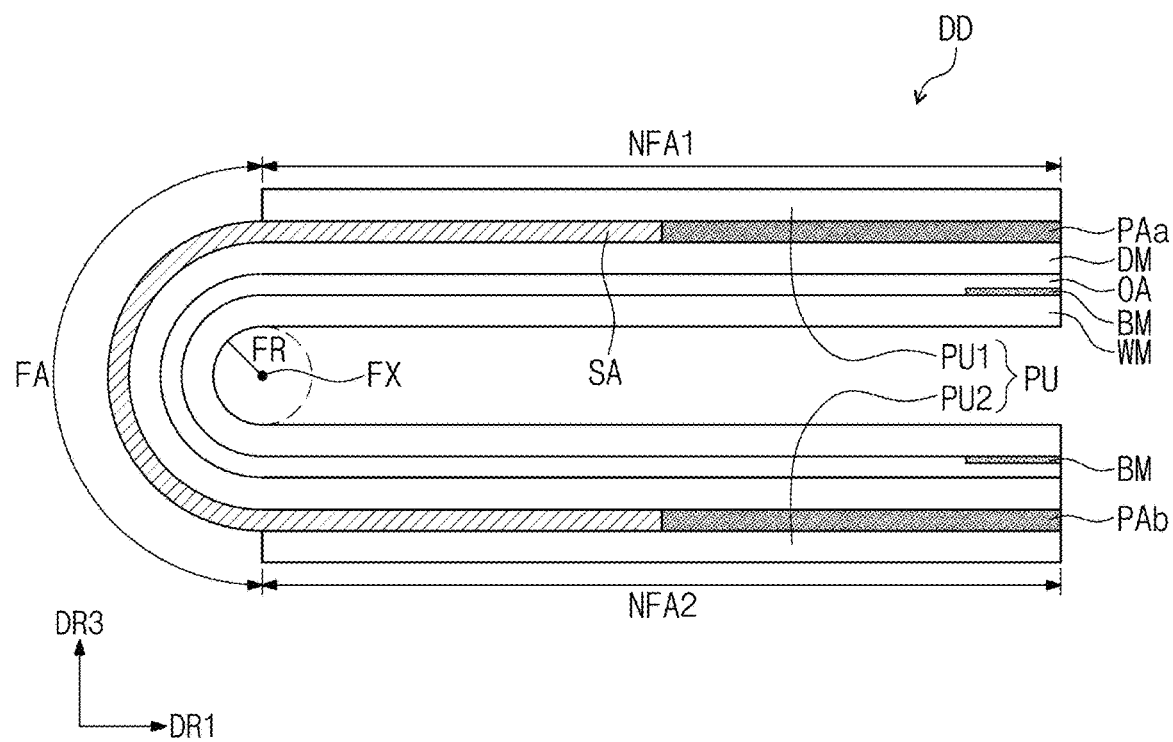
FIG. 3 is a cross-sectional view illustrating an exemplary embodiment of the folded display device according to the invention.

FIG. 3 is a cross-sectional view illustrating an exemplary embodiment of the folded display device according to the invention.

Referring to FIG. 3, the inner folded display device DD is illustrated. When the display device DD is inner folded, an inner space of the display device DD may be defined along a curvature radius FR. In an exemplary embodiment of the invention, when the display device DD is inner or outer folded, the inner space is defined. However, the invention is not limited thereto. That is, when the display device DD is inner or outer folded, the inner space may not be defined.

Specifically, the display device DD includes a display module DM, a window member WM, a reinforcing member SA, a protection member, and an adhesion member. In an exemplary embodiment of the invention, each of the display module DM, the window member WM, and the reinforcing member SA may have a flexible property. That is, each of the display module DM, the window member WM, and the reinforcing member SA may include a flexible material.

The display module DM includes the folding area FA, the first non-folding area NFA1, and the second non-folding area NFA2.

The protection member includes a first protection plate PU1 and a second protection plate PU2. The first protection plate PU1 is disposed on the first non-folding area NFA1, and the second protection plate PU2 is disposed on the second non-folding area NFA2. In particular, the first protection plate PU1 may be disposed over the entire first non-folding area NFA1, and the second protection plate PU2 may be disposed over the entire second non-folding area NFA2. When the display device DD is folded, the first protection plate PU1 and the second protection plate PU2 may face each other in the third direction DR3.

In an exemplary embodiment of the invention, each of the first protection plate PU1 and the second protection plate PU2 does not overlap the folding area FA. As described above, as the protection member does not overlap the folding area FA, when the display device DD is folded along the folding axis FX, a stress that is generated on the folding area FA of the display device DD may be reduced.

The adhesion member includes a first adhesion member PAa and PAb and a second adhesion member OA. The first adhesion member PAa and PAb may be disposed between the display module DM and the first and second protection plates PU1 and PU2 to fix the display module DM and the first and second protection plates PU1 and PU2. In an exemplary embodiment, the adhesion member may include a pressure sensitive adhesive (hereinafter, referred to as "PSA") or an optically clear adhesive film (hereinafter, referred to as "OCA"), for example. The second adhesion member OA will be described later in detail.

The first adhesion member PAa and PAb includes a first adhesion portion PAa disposed between the first non-folding area NFA1 of the display module DM and the first protection plate PU1 and a second adhesion portion PAb disposed between the second non-folding area NFA2 of the display module DM and the second protection plate PU2. When the display device DD is folded, the first adhesion portion PAa and the second adhesion portion PAb may face each other in the third direction DR3. In an exemplary embodiment, the first adhesion member PAa and PAb may be the PSA, for example.

In an exemplary embodiment of the invention, the first adhesion portion PAa may be disposed on one area of the first non-folding area NFA1, and the second adhesion portion PAb may be disposed on one area of the second non-folding area NFA2. As a result, in a plan view of the display module DM, the first adhesion portion PAa may have an area less than that of the first protection plate PU1. In a plan view of the display module DM, the second adhesion portion PAb may have an area less than that of the second protection plate PU2.

Also, the first adhesion portion PAa and the second adhesion portion PAb may not be attached to the folding area FA. That is, when the first adhesion portion PAa and the second adhesion portion PAb are attached to the folding area FA of the display module DM, the display module DM may not be easily folded due to the adhesion property of each of the first adhesion portion PAa and the second adhesion portion PAb.

In an exemplary embodiment of the invention, the reinforcing member SA may be provided in the same layer as the first adhesion portion PAa and the second adhesion portion PAb. The reinforcing member SA may be disposed on the folding area FA and the first and second non-folding areas NFA1 and NFA2. In an exemplary embodiment, the reinforcing member SA may be disposed over the entire folding area FA and disposed on one portion of the first and second non-folding areas NFA1 and NFA2, for example. The reinforcing member SA overlapping the folding area FA may not be covered by the protection member and thus may be exposed to the outside.

As illustrated in FIG. 3, the reinforcing member SA may have one end connected to the first adhesion portion PAa and the other end connected to the second adhesion portion PAb. In particular, the reinforcing member SA may have one end contacting the first adhesion portion PAa and the other end contacting the second adhesion portion PAb. As a result, a separate spaced space may not be defined between the reinforcing member SA and the first adhesion member PAa and PAb, which are provided in the same layer.

According to another comparative embodiment of the invention, it is assumed that a spaced space is defined between the reinforcing member SA and the first adhesion member PAa and PAb. In this case, a stepped portion may be generated between the reinforcing member SA and the spaced space or between the first adhesion member and the spaced space. As a shape of the stepped portion is seen from the outside by light provided from the outside, overall visibility of the display device may be degraded.

However, in an exemplary embodiment of the invention, the spaced space between the reinforcing member SA and the first adhesion member PAa and PAb may not be defined. As a result, the shape of the stepped portion between the reinforcing member SA and the first adhesion member PAa and PAb may not be seen.

In an exemplary embodiment of the invention, the reinforcing member SA may include a flexible material. In an exemplary embodiment, the reinforcing member SA may include at least one of an acrylic-based polymer, a silicon-based polymer, and an imide-based polymer, for example.

When the reinforcing member SA has a modulus value less than about 500 megapascals (MPa), since a sufficient strength for protecting the folding area FA is not secured, a crack may be generated in the reinforcing member SA during an impact strength test or the like. Also, when reinforcing member SA has a modulus value greater than about 1200 MPa, since elasticity thereof is reduced, the reinforcing member SA may be easily broken. In an exemplary embodiment, the reinforcing member SA of an exemplary embodiment of the display device DD may have a modulus value equal to or greater than about 700 MPa or more and equal to or less than about 1200 MPa, more particularly, equal to or greater than about 700 MPa or equal to or less than about 1000 MPa, for example.

That is, the reinforcing member SA may have an appropriate modulus value equal to or greater than about 500 MPa and equal to or less than about 1200 MPa to have all of flexibility for preventing a crack from being generated and impact resistance for protecting the folding area FA against an external impact.

As described above, the reinforcing member SA may prevent the crack generated in the folding area FA of the display module DM to prevent moisture or the like from being introduced into the display module DM.

The window member WM may be disposed on the display module DM and disposed between the first and second protection plates PU1 and PU2 and the window member WM. The window member WM includes a base member and a black matrix BM. The black matrix BM may be disposed on a rear surface of the base member, which faces the display module DM, to define the non-display area NDA (refer to FIG. 1) of the display device DD. The base member may include a glass substrate, a sapphire substrate, a plastic substrate, a film, and the like. The black matrix BM, which is a colored organic layer, may be provided through, e.g., a coating method. However, the invention is not limited thereto. In an exemplary embodiment, when the entire surface of the display module DM is the display surface for displaying an image, the black matrix BM may be omitted, for example.

The second adhesion member OA may be disposed between the window member WM and the display module DM to fix the window member WM and the display module DM. In an exemplary embodiment, the second adhesion member OA may be the OCA, for example.

Figure 4:
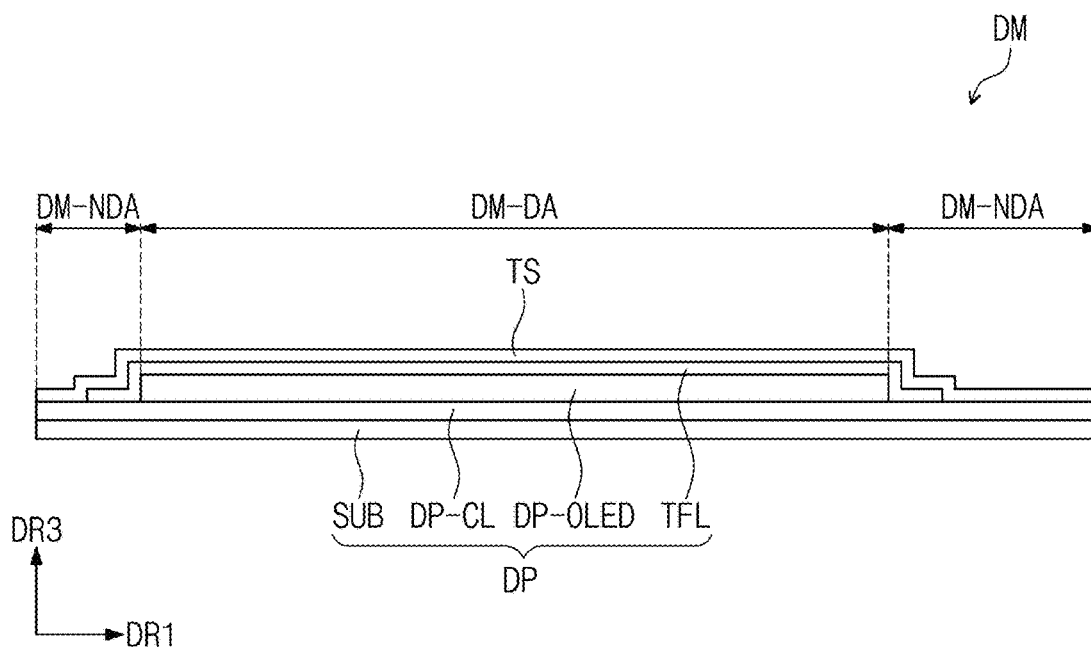
FIG. 4 is a cross-sectional view illustrating an exemplary embodiment of a display module according to the invention.
Figure 5A:
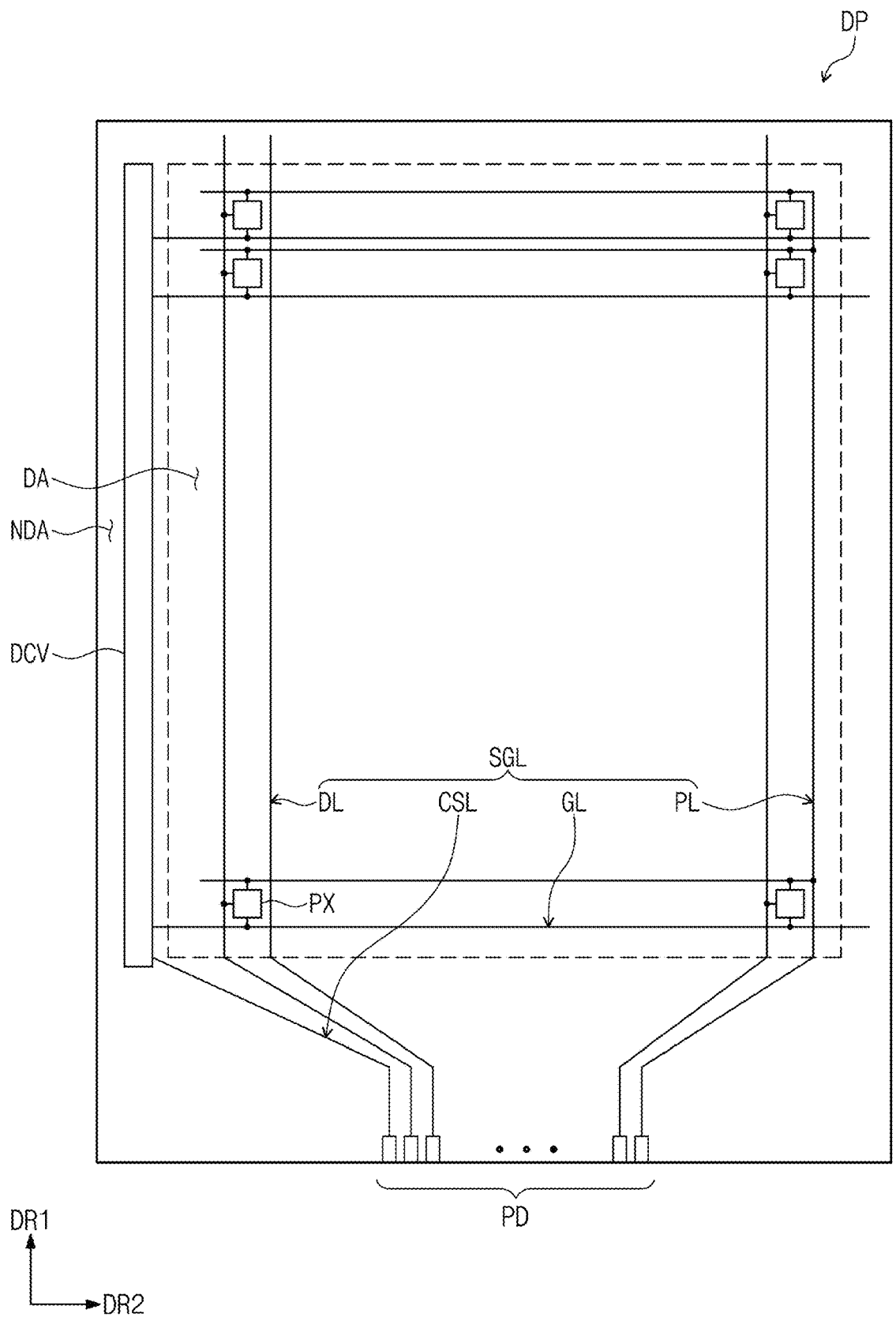
FIG. 5A is a plan view illustrating a display panel in FIG. 4.
Figure 5B:
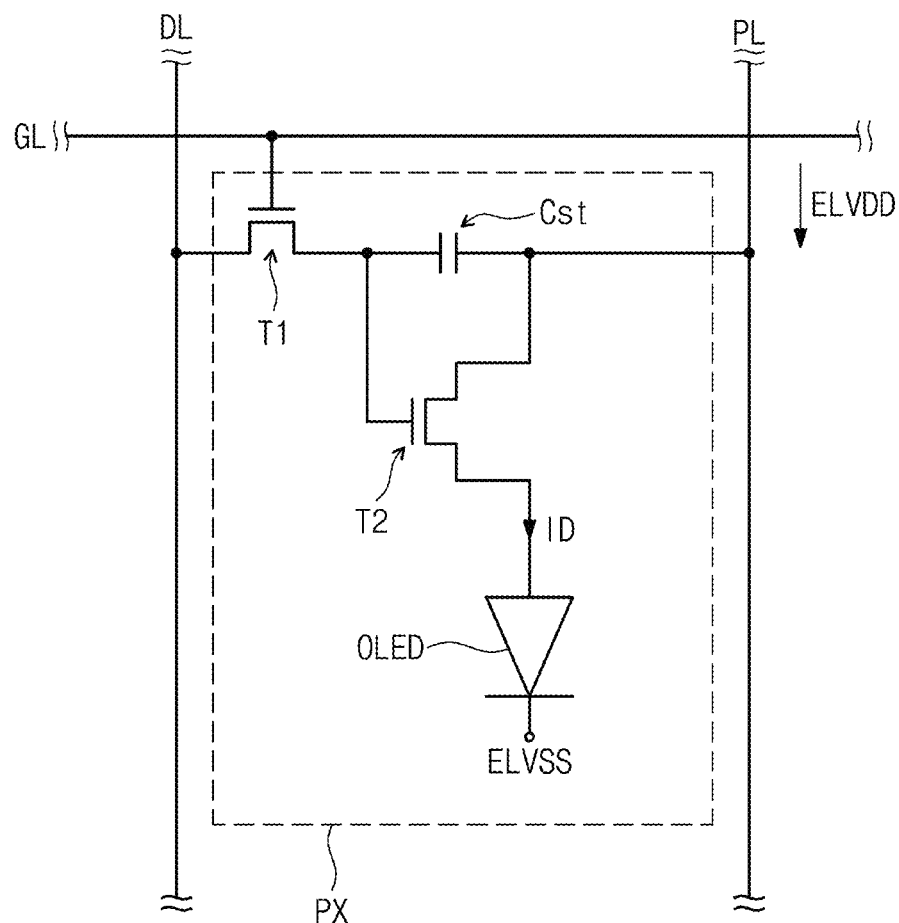
FIG. 5B is an equivalent circuit diagram illustrating a pixel of FIG. 5A.
Figure 5C:
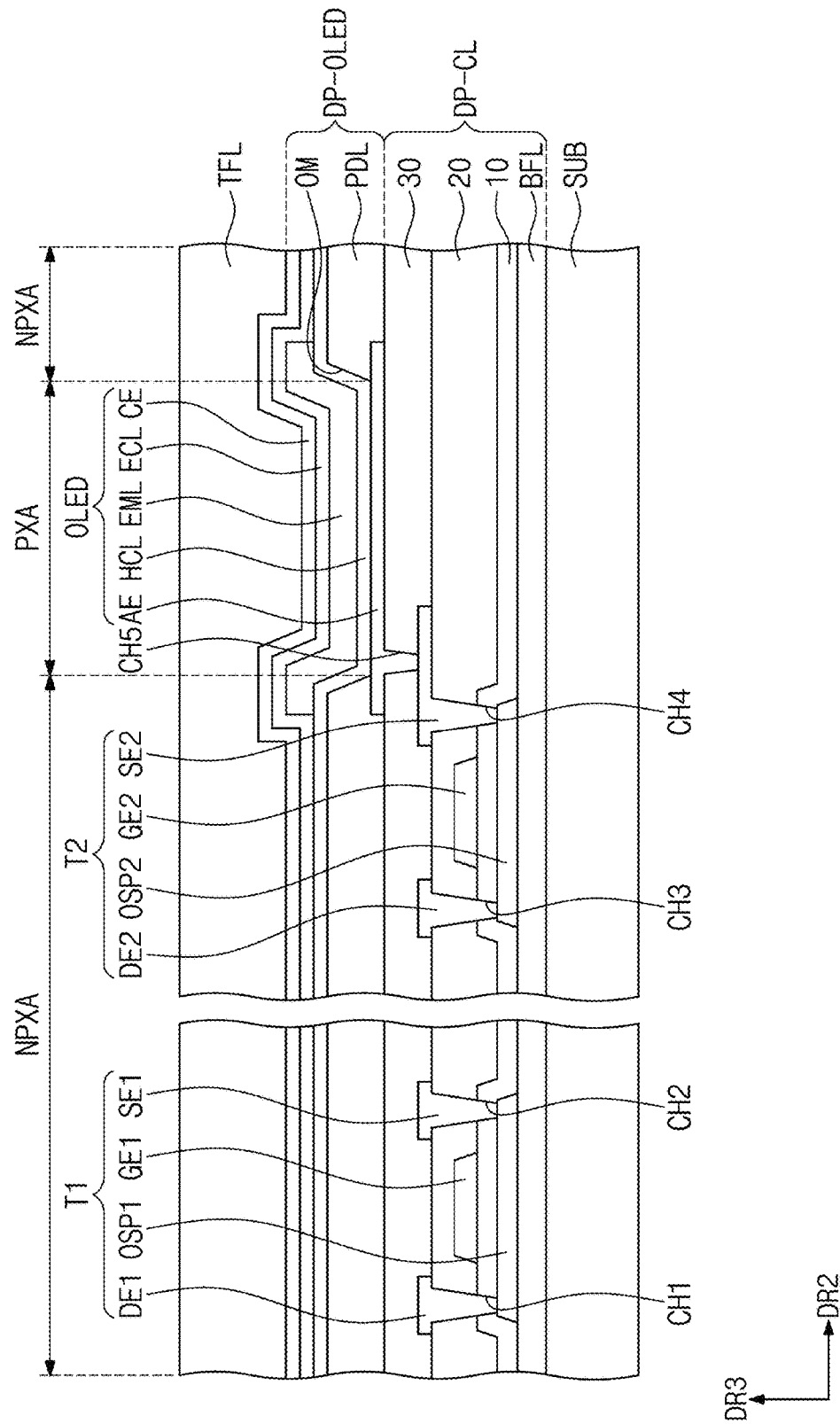
FIG. 5C is an enlarged cross-sectional view illustrating an exemplary embodiment of the display panel according to the invention.

FIG. 4 is a cross-sectional view illustrating an exemplary embodiment of the display module according to the invention. FIG. 5A is a plan view illustrating a display panel in FIG. 4. FIG. 5B is an equivalent circuit diagram illustrating a pixel of FIG. 5A. FIG. 5C is an enlarged cross-sectional view illustrating an exemplary embodiment of the display panel according to the invention.

Referring to FIG. 4, the display module DM includes a display panel DP and an input sensing unit TS (or touch sensing unit). The display panel DP may be disposed on a protection member PU (refer to FIG. 3), and the input sensing unit TS may be disposed on the display panel DP.

Although the display panel DP may be a light emitting-type display panel, the invention is not limited thereto. In an exemplary embodiment, the display panel DP may be an organic light emitting display panel or a quantum dot light emitting display panel, for example. The organic light emitting display panel include an organic light emitting material. The quantum dot light emitting display panel includes a light emitting layer including a quantum dot and a quantum rod. Hereinafter, the display panel DP will be described as the organic light emitting display panel as an example.

The display panel DP includes a base layer SUB, a circuit element layer DP-CL disposed on the base layer SUB, a display element layer DP-OLED, and an insulation layer TFL. The input sensing unit SU may be directly disposed on the insulation layer TFL. In this specification, an expression of "A component is directly disposed on B component" represents that an adhesion layer is not disposed between the A component and the B component.

The base layer SUB may include at least one plastic film. The base layer SUB, which is a flexible substrate, may include a plastic substrate, a glass substrate, a metal substrate, or an organic/inorganic composite substrate. The display area DA and the non-display area NDA, which are described with reference to FIG. 1, may correspond to a display area DM-DA and a non-display area DM-NDA, which are defined on the base layer SUB, respectively.

The circuit element layer DP-CL includes at least one intermediate insulation layer and a circuit element. The intermediate insulation layer includes at least one intermediate inorganic layer and at least one intermediate organic layer. The circuit element includes signal lines and a driving circuit of a pixel.

The display element layer DP-OLED includes at least organic light emitting diodes. The display element layer DP-OLED may further include an organic layer such as a pixel defining layer.

The insulation layer TFL seals the display element layer DP-OLED. In an exemplary embodiment, the insulation layer TFL may be a thin-film encapsulation layer, for example. The insulation layer TFL protects the display element layer DP-OLED from moisture, oxygen, and foreign substances such as dust particles. Although the insulation layer TFL overlaps each of the display area DM-DA and the non-display area DM-NDA as illustrated in FIG. 4, the invention is not limited thereto. In an exemplary embodiment, the insulation layer TFL may not overlap the non-display area DM-NDA, for example.

Referring to FIG. 5A, the display panel DP includes a scan driving circuit DCV, a plurality of signal lines SGL, a plurality of pixels PX, and a plurality of driving pads PD. The display area DA is defined as an area on which the plurality of pixels PX are disposed. The scan driving circuit DCV, the plurality of signal lines SGL, and the pixel driving circuit may be included in the circuit element layer DP-CL in FIG. 4.

The scan driving circuit DCV generates a plurality of scan signals and sequentially outputs the plurality of scan signals to a plurality of gate lines GL that will be described later. The scan driving circuit DCV may further output another control signal to the driving circuit of each of the pixels PX.

The scan driving circuit DCV may include a plurality of thin-film transistors ("TFTs") that are provided through the same process as the driving circuit of each of the pixels PX, e.g., a low temperature polycrystalline silicon ("LTPS") process or a low temperature polycrystalline oxide ("LTPO") process.

The plurality of signal lines SGL include gate lines GL, data lines DL, a power line PL, and a control signal line CSL. Each of the gate lines GL is connected to a corresponding pixel PX of the plurality of pixels PX, and each of the data lines DL is connected to a corresponding pixel PX of the plurality of pixels PX. The power line PL is connected to the plurality of pixels PX. Also, the scan driving circuit DCV connected to the gate lines GL may be disposed on the non-display area NDA. The control signal line CSL may provide control signals to the scan driving circuit DCV.

Some of the gate lines GL, the data lines DL, the power line PL, and the control signal line CSL are disposed on the same layer, and some of them are disposed on a different layer. When signal lines, which are disposed on one layer, of the gate lines GL, the data lines DL, the power line PL, and the control signal line CSL are defined as a first signal line, signal lines disposed on another layer may be defined as a second signal line. Signal lines disposed on another layer may be defined as a third signal line.

The display panel DP may include the plurality of driving pads PD that are electrically connected to the data lines DL, the power line PL, and the control signal line CSL. The driving pads PD may overlap the non-display area NDA.

In FIGS. 5A and 5B, the pixel PX connected to one of the gate lines GL, one of the data lines DL, and the power line PL is exemplarily illustrated. However, the exemplary embodiment of the invention is not limited to the configuration of the pixel PX.

The pixel PX includes an organic light emitting diode OLED as a display element. The organic light emitting diode OLED may be included in the display element layer DP-OLED in FIG. 4. The organic light emitting diode OLED may be a front light emitting diode or a rear light emitting diode. The pixel PX, which is a circuit for driving the organic light emitting diode OLED, includes a first transistor T1 (or switching transistor), a second transistor T2 (or driving transistor), and a capacitor Cst. The organic light emitting diode OLED generates light by an electric signal provided from the first and second transistors T1 and T2.

The first transistor T1 outputs a data signal applied to the data line DL in response to a scan signal applied to the gate line GL. The capacitor Cst charges a voltage corresponding to a data signal received from the first transistor Ti. A first power voltage ELVDD is provided to the second transistor T2, and a second power voltage ELVSS is provided to the organic light emitting diode OLED. An absolute value of a voltage level of the second power voltage ELVSS may be less than that of the first power voltage ELVDD.

The second transistor T2 is connected to the organic light emitting diode OLED. The second transistor T2 controls a driving current ID flowing through the organic light emitting diode OLED in correspondence to an electric charge quantity stored in the capacitor Cst. The organic light emitting diode OLED emits light during a turn-on interval of the second transistor T2.

Referring to FIG. 5C, a partial cross-section of the display panel DP corresponding to the equivalent circuit in FIG. 5B is illustrated. The circuit element layer DP-CL, the display element layer DP-OLED, and the insulation layer TFL are sequentially arranged on the base layer SUB.

The circuit element layer DP-CL includes at least one insulation layer and a circuit element. The circuit element includes a signal line and a driving circuit of a pixel. The circuit element layer DP-CL may be provided through a process of forming an insulation layer, a semiconductor layer, and a conductive layer by coating, deposition, or the like and a process of patterning an insulation layer, a semiconductor layer, and a conductive layer by a photolithography process.

The circuit element layer DP-CL may include a buffer layer BFL that is an inorganic layer, a first intermediate inorganic layer 10, a second intermediate inorganic layer 20, and an intermediate organic layer 30 that is an organic layer. The buffer layer BFL may include a plurality of inorganic layers that are laminated. In FIG. 5C, an arrangement relationship between a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which constitute a switching transistor T1 and a driving transistor T2, is exemplarily illustrated. Also, first to fourth through-holes CHL CH2, CH3, and CH4 are exemplarily illustrated.

The display element layer DP-OLED may include organic light emitting diodes OLED as a light emitting element. The display element layer DP-OLED includes a pixel defining layer PDL. In an exemplary embodiment, the pixel defining layer PDL may be an organic layer, for example.

A first electrode AE is disposed on the intermediate organic layer 30. The first electrode AE is connected to the second output electrode SE2 through a fifth through-hole CH5 passing through the intermediate organic layer 30. An opening OM is defined in the pixel defining layer PDL. The opening OM of the pixel defining layer PDL exposes at least a portion of the first electrode AE. The opening OM of the pixel defining layer PDL is referred to as a light emitting opening to be distinguished from other openings.

Although not separately shown, a spacer that overlaps a portion of the pixel defining layer PDL may be disposed on a top surface of the pixel defining layer PDL. The spacer may be an insulation structure that is unitary with the pixel defining layer PDL or provided through an additional process.

As illustrated in FIG. 5A, the display panel DP may include a light emitting area PXA and a non-light emitting area NPXA disposed adjacent to the light emitting area PXA. The non-light emitting area NPXA may surround the light emitting area PXA. In this exemplary embodiment, the light emitting area PXA is defined in correspondence to a partial area of the first electrode AE, which is exposed by the opening OM.

A hole control layer HCL may be disposed in common on the light emitting area PXA and the non-light emitting area NPXA. The hole control layer HCL may include a hole transporting layer and further include a hole injection layer. A light emitting layer EML is disposed on the hole control layer HCL. The light emitting layer EML may be disposed on an area corresponding to the light emitting opening OM. That is, the light emitting layer EML may be separately provided on each of the pixels. The light emitting layer EML may include an organic material and/or an inorganic material. The light emitting layer EML may generate color light having a predetermined color.

An electron control layer ECL is disposed on the light emitting layer EML. The electron control layer ECL may include an electron transporting layer and further include an electron injection layer. The hole control layer HCL and electron control layer ECL may be provided in common on the plurality of pixels by an open mask. A second electrode CE is disposed on the electron control layer ECL. The second electrode CE is disposed in common on the electron control layer ECL that is included in each of the plurality of pixels.

The insulation layer TFL is disposed on the second electrode CE. The insulation layer TFL may be a single encapsulation layer or a plurality of thin-films.

Referring back to FIG. 4, the input sensing unit TS may be disposed on the insulation layer TFL. The input sensing unit TS may be directly disposed on the insulation layer TFL. In an alternative exemplary embodiment, the input sensing unit TS may be connected to the insulation layer TFL through an adhesion layer. The input sensing unit (e.g., touch sensing unit) TS may include a conductive layer having a single-layer or multi-layers. Also, the input sensing unit (e.g., touch sensing unit) TS may include an insulation layer having a single-layer or multi-layers.

In an exemplary embodiment, the input sensing unit TS may detect an input applied from the outside through a capacitive method, for example. The input applied from the outside may be provided in various types. In an exemplary embodiment, an external input includes various types of external inputs such as a part of a user's body, a stylus pen, light, heat, or pressure, for example. Also, in addition to the input generated by contact of a portion of a human body such as user's hands, a space touch (e.g. hovering), i.e., being close or adjacent, may be one type of the input.

However, the exemplary embodiment of the invention is not particularly limited to the operation method of the touch sensing unit TS. In an exemplary embodiment, the touch sensing unit TS may detect an external input in an electro-magnetic induction manner or a pressure sensing manner, for example. According to another exemplary embodiment of the invention, the input sensing unit TS may be separately manufactured and then attached to the display panel DP, or may be omitted.

Figure 6:
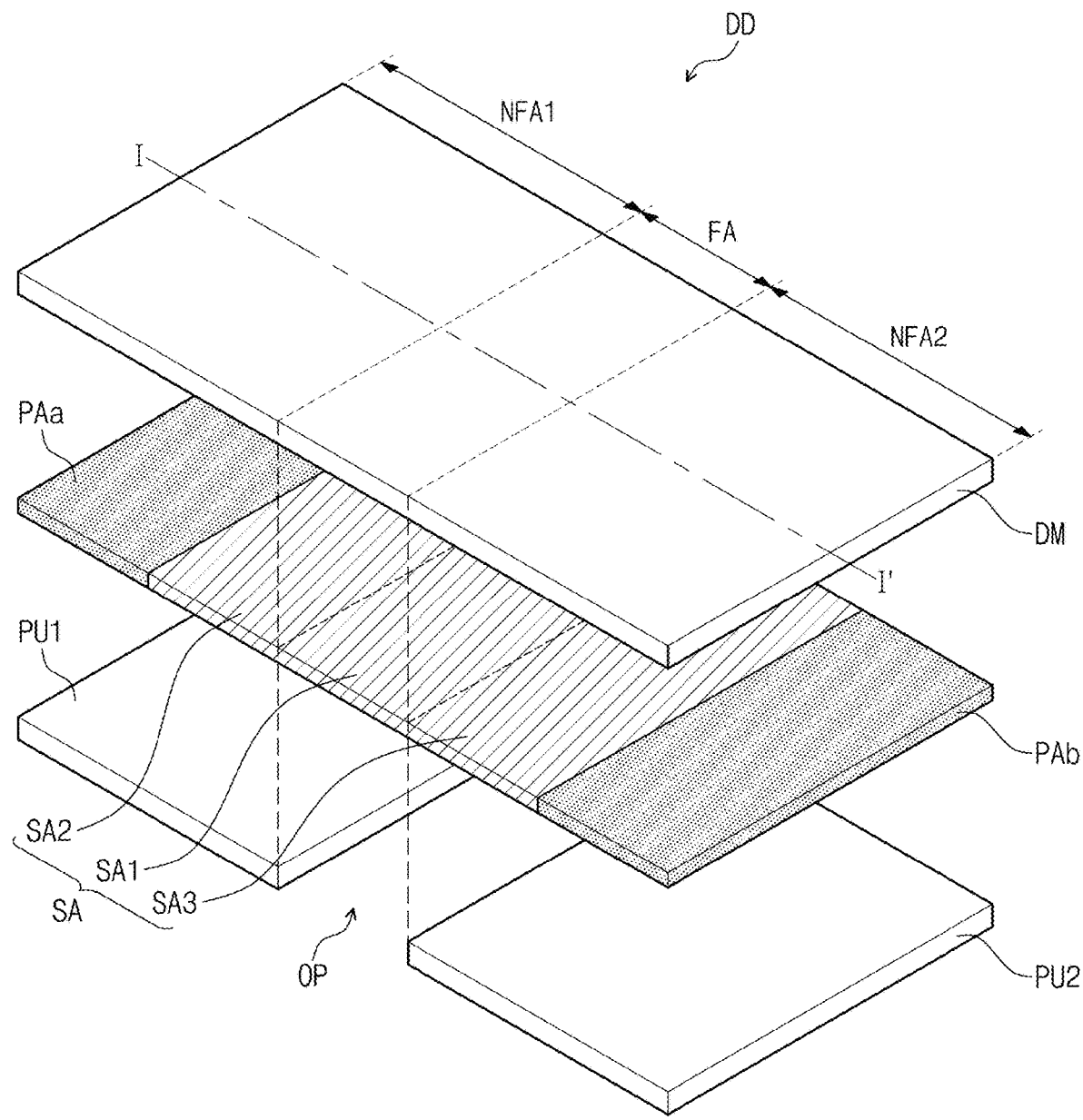
FIG. 6 is an exploded perspective view illustrating an exemplary embodiment of the display device according to the invention.
Figure 7:
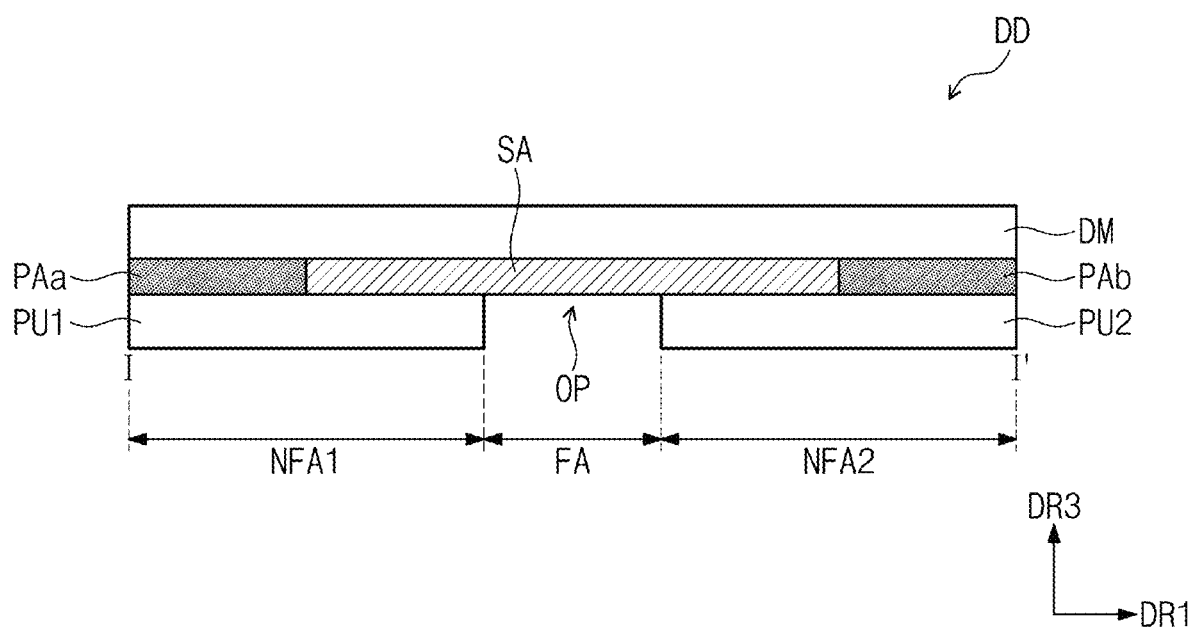
FIG. 7 is a cross-sectional view taken along line I-I' of an exemplary embodiment of FIG. 6 according to the invention.

FIG. 6 is an exploded perspective view illustrating an exemplary embodiment of the display device according to the invention. FIG. 7 is a cross-sectional view taken along line I-I' of an exemplary embodiment of FIG. 6 according to the invention.

FIG. 6 is an exploded perspective view illustrating the display device DD in a non-folding state. In FIGS. 6 and 7, the window member WM in FIG. 3 is omitted for convenience of description.

Referring to FIGS. 6 and 7, the protection member includes a first protection plate PU1 and a second protection plate PU2, which are spaced apart from each other with a spaced space OP, which overlaps the folding area FA, therebetween.

The reinforcing member SA may include a central portion SA1, and a first portion SA2 and a second portion SA3 which are spaced apart from each other with the central portion SA1 therebetween. When the display module DM is folded, the first portion SA2 and the second portion SA3 may face each other in the third direction DR3.

In an exemplary embodiment of the invention, the central portion SA1, the first portion SA2, and the second portion SA3 may have the same thickness as each other in the third direction DR3, i.e., a thickness direction of the display module DM. The central portion SA1, the first portion SA2, and the second portion SA3 may be unitary with each other. Also, the reinforcing member SA, the first adhesion portion PAa, and the second adhesion portion PAb may be provided in the same layer and have the same thickness as each other.

The central portion SA1 may be disposed on the folding area FA. An exemplary embodiment of the central portion SA1 according to the invention may be exposed to the outside by the spaced space OP between the first protection plate PU1 and the second protection plate PU2.

The first portion SA2 is disposed between the other area of the first non-folding area NFA1 and the first protection plate PU1. The other area of the first non-folding area NFA1 may be the rest area of the entire first non-folding area NFA1 except for one area of the first non-folding area NFA1, on which the first adhesion portion PAa is disposed.

The second portion SA3 is disposed between the other area of the second non-folding area NFA2 and the second protection plate PU2. The other area of the second non-folding area NFA2 may be the rest area of the entire second non-folding area NFA2 except for one area of the second non-folding area NFA2, on which the second adhesion portion PAb is disposed.

The first adhesion portion PAa contacts the one area of the first non-folding area NFA1, the first protection plate PU1, and the first portion SA2. The first adhesion portion PAa may have a top surface that is attached to the one area of the first non-folding area NFA1 and a bottom surface that is disposed on a top surface of the first protection plate PU1. The first portion SA2 may be attached to the first adhesion portion PAa through one side surface of the first adhesion portion PAa.

The second adhesion portion PAb contacts the one area of the second non-folding area NFA2, the second protection plate PU2, and the second portion SA3. The second adhesion portion PAb may have a top surface that is attached to the one area of the second non-folding area NFA2 and a bottom surface that is disposed on a top surface of the second protection plate PU2. The second portion SA3 may be attached to the second adhesion portion PAb through one side surface of the second adhesion portion PAb.

In an exemplary embodiment of the invention, the first adhesion portion PAa and the second adhesion portion PAb may be attached to the first non-folding area NFA1 and the second non-folding area NFA2 of the display module DM, respectively, and then the reinforcing member SA may be disposed on the display module DM.

Specifically, the first adhesion portion PAa and the second adhesion portion PAb may be attached to the display module DM, and then the reinforcing member SA in a liquid state may be applied on a portion of the display module DM, on which the first adhesion portion PAa and the second adhesion portion PAb are not attached, by an application instrument. In an exemplary embodiment, a material forming the reinforcing member SA may be at least one of the acrylic-based polymer, the silicon-based polymer, and the imide-based polymer, for example, which are previously described in FIG. 3.

In an exemplary embodiment, the reinforcing member SA in a liquid state, which is applied on the display module DM, may have an adhesion property. The reinforcing member SA in a liquid state may be applied on the display module DM in correspondence to a thickness of each of the first adhesion portion PAa and the second adhesion portion PAb.

After the reinforcing member SA in a liquid state is applied on the display module DM, the reinforcing member SA may be cured by ultraviolet ("UV") rays or heat. As the curing is processed, the adhesion property of the reinforcing member SA may be removed. As the adhesion property of the cured reinforcing member SA is removed, the reinforcing member SA may not be attached to the display module DM. Thus, the display module DM and the reinforcing member SA may be easily folded along the folding axis FX (refer to FIG. 1).

Figure 8A:
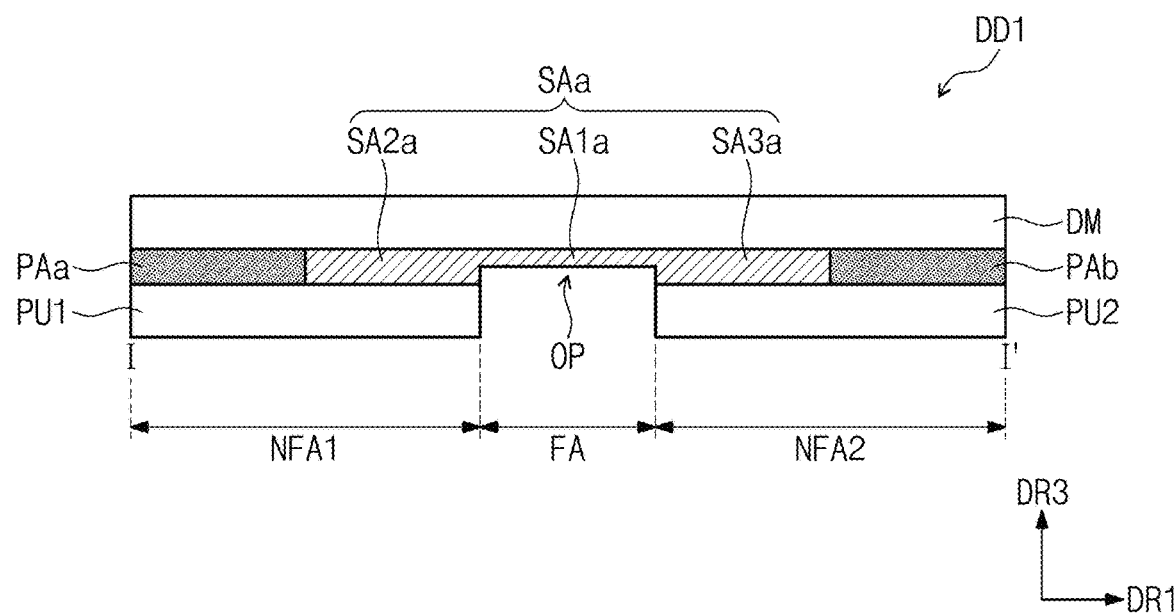
FIG. 8A is a cross-sectional view illustrating another exemplary embodiment of a display device according to the invention.
Figure 8B:
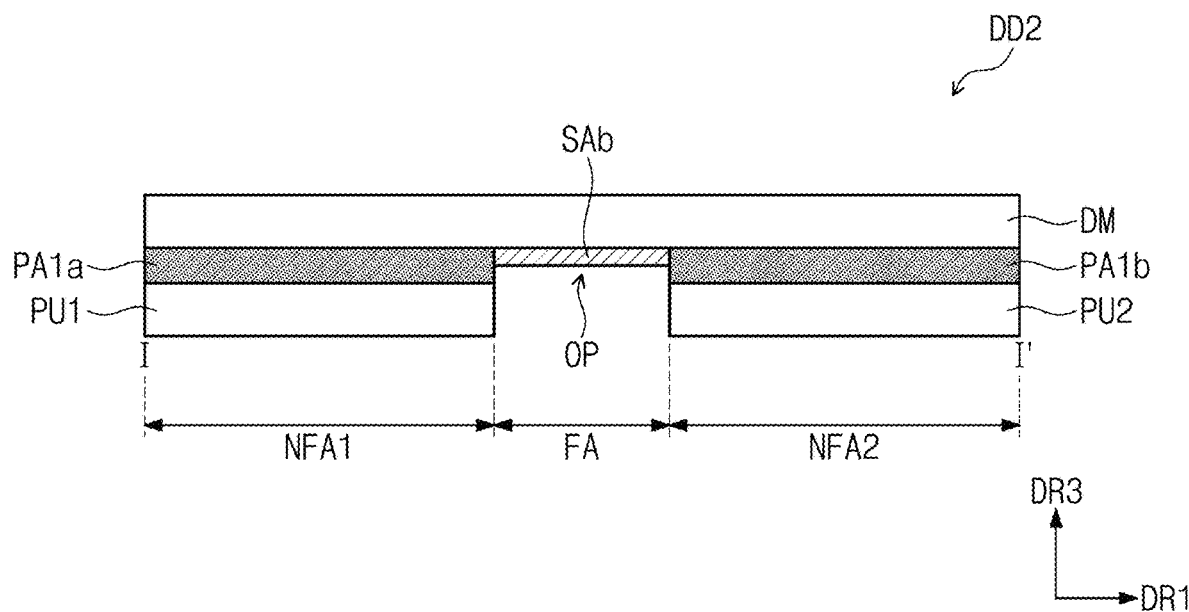
FIG. 8B is a cross-sectional view illustrating another exemplary embodiment of a display device according to the invention.

FIG. 8A is a cross-sectional view illustrating another exemplary embodiment of a display device according to the invention. FIG. 8B is a cross-sectional view illustrating another exemplary embodiment of a display device according to the invention.

A display device DD1 in FIG. 8A may have substantially the same configuration as that of the display device DD in FIG. 7 except for a modified configuration of a reinforcing member SAa. Accordingly, the modified reinforcing member SAa will be mainly described in FIG. 8A, and description for the rest components will be omitted for convenience of description.

Referring to FIG. 8A, the reinforcing member SAa includes a central portion SA1a, and a first portion SA2a and a second portion SA3a, which are spaced apart from each other with the central portion SA1a therebetween. When a display module DM is folded, the first portion SA2a and the second portion SA3a may face each other in the third direction DR3.

In an exemplary embodiment of the invention, the reinforcing member SAa may have different thicknesses for each area. In particular, the central portion SA1a may have a thickness less than that of each of the first portion SA2a and the second portion SA3a. The first portion SA2a and the second portion SA3a may have the same thickness as each other. The central portion SA1a, the first portion SA2a, and the second portion SA3a may be unitary with each other.

A first adhesion portion PAa contacts one area of a first non-folding area NFA1, a first protection plate PU1, and the first portion SA2a. The first adhesion portion PAa may have a top surface that is attached to the one area of the first non-folding area NFA1 and a bottom surface that is disposed on a top surface of the first protection plate PU1. The first portion SA2a may be attached to the first adhesion portion PAa through one side surface of the first adhesion portion PAa.

A second adhesion portion PAb contacts one area of a second non-folding area NFA2, a second protection plate PU2, and the second portion SA3a. The second adhesion portion PAb may have a top surface that is attached to the one area of the second non-folding area NFA2 and a bottom surface that is disposed on a top surface of the second protection plate PU2. The second portion SA3a may be attached to the second adhesion portion PAb through one side surface of the second adhesion portion PAb.

As described above, the central portion SA1a may have a thickness less than that of each of the first portion SA2a and the second portion SA3a. As a result, when the display device DD is folded, a stress in the folding area FA may be further reduced.

A display device DD2 in FIG. 8B may have substantially the same configuration as that of the display device DD in FIG. 7 except for a reinforcing member SAb and an adhesion member. Accordingly, the modified reinforcing member SAb and the modified adhesion member will be mainly described in FIG. 8B, and description for the rest components will be omitted for convenience of description.

An adhesion member includes a first adhesion portion PA1a and a second adhesion portion PA1b.

In an exemplary embodiment of the invention, a first adhesion portion PA1a is disposed between a first non-folding area NFA1 of a display module DM and a first protection plate PU1. In particular, the first adhesion portion PA1a may be disposed over an entire top surface of the first protection plate PU1 and the entire first non-folding area NFA1 of the display module DM.

A second adhesion portion PA1b is disposed between a second non-folding area NFA2 of the display module DM and a second protection plate PU2. In particular, the second adhesion portion PA1b may be disposed over an entire top surface of the second protection plate PU2 and the entire second non-folding area NFA2 of the display module DM.

The reinforcing member SAb may be disposed on a folding area FA of the display module DM. An exemplary embodiment of the reinforcing member SAb according to the invention may not contact each of the first non-folding area NFA1 and the second non-folding area NFA2 of the display module DM.

In an exemplary embodiment of the invention, the reinforcing member SAb may have a thickness less than that of each of the first adhesion portion PA1a and the second adhesion portion PA1b.

Figure 9:
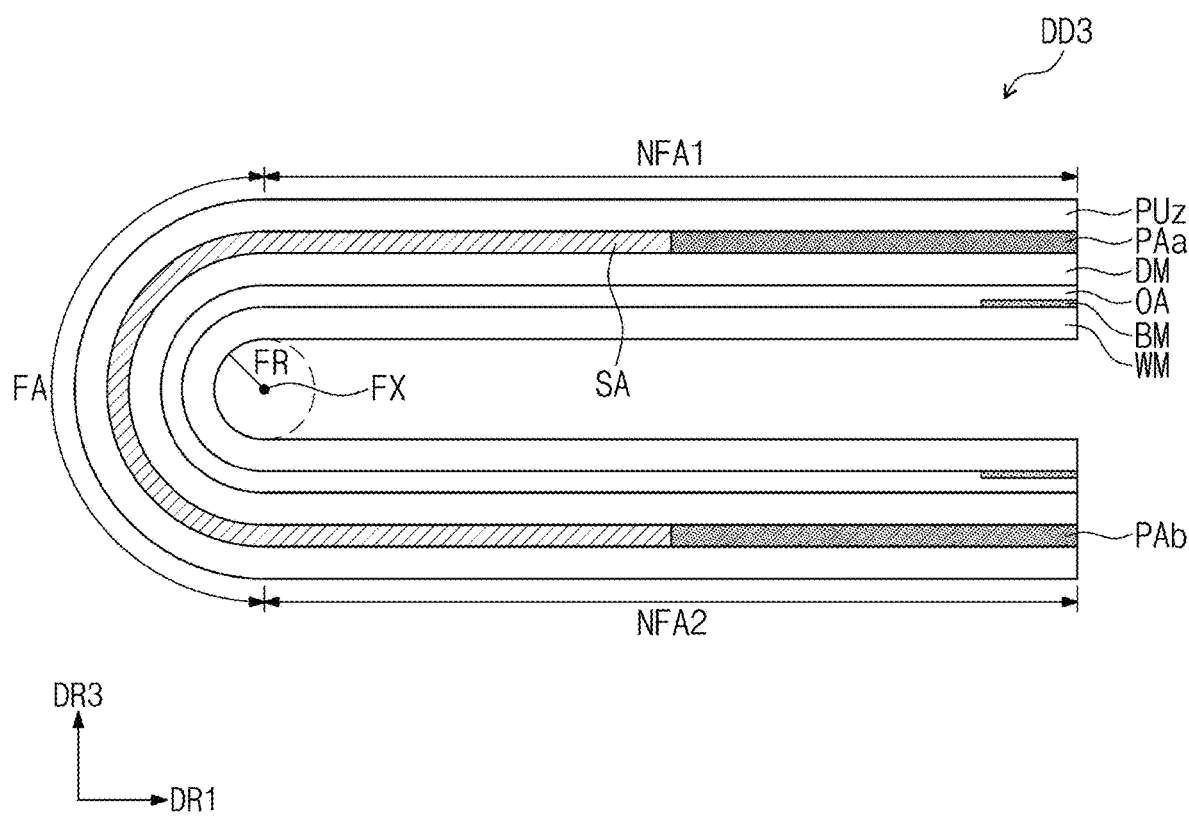
FIG. 9 is a cross-sectional view illustrating another exemplary embodiment of a folded display device according to the invention.
Figure 10A:
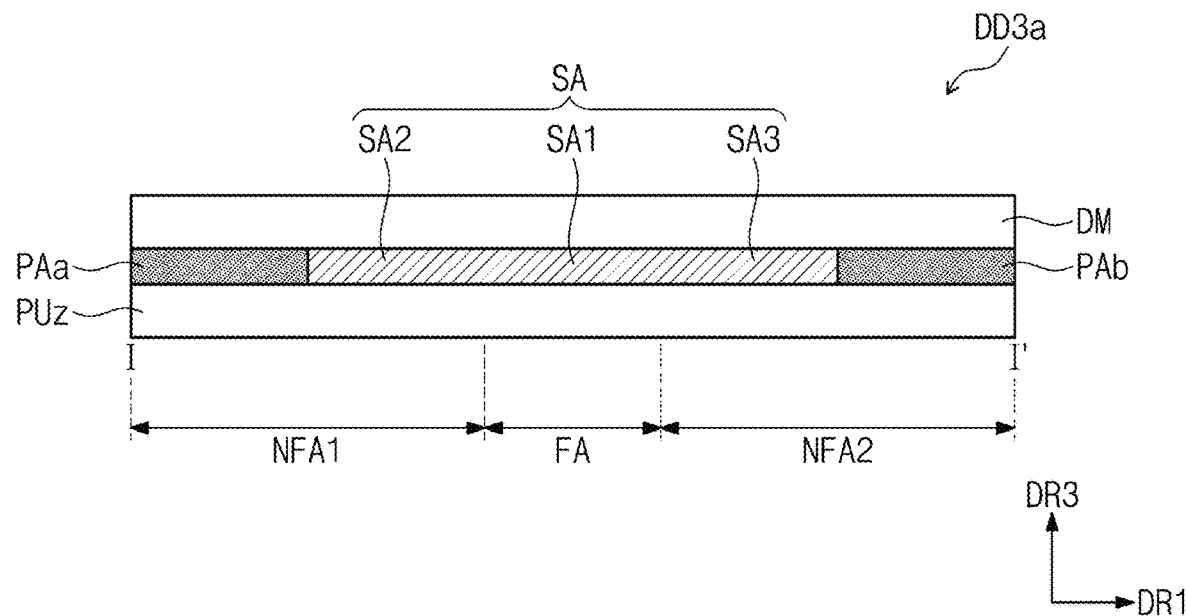
FIG. 10A is a cross-sectional view illustrating another exemplary embodiment of a display device according to the invention.
Figure 10B:
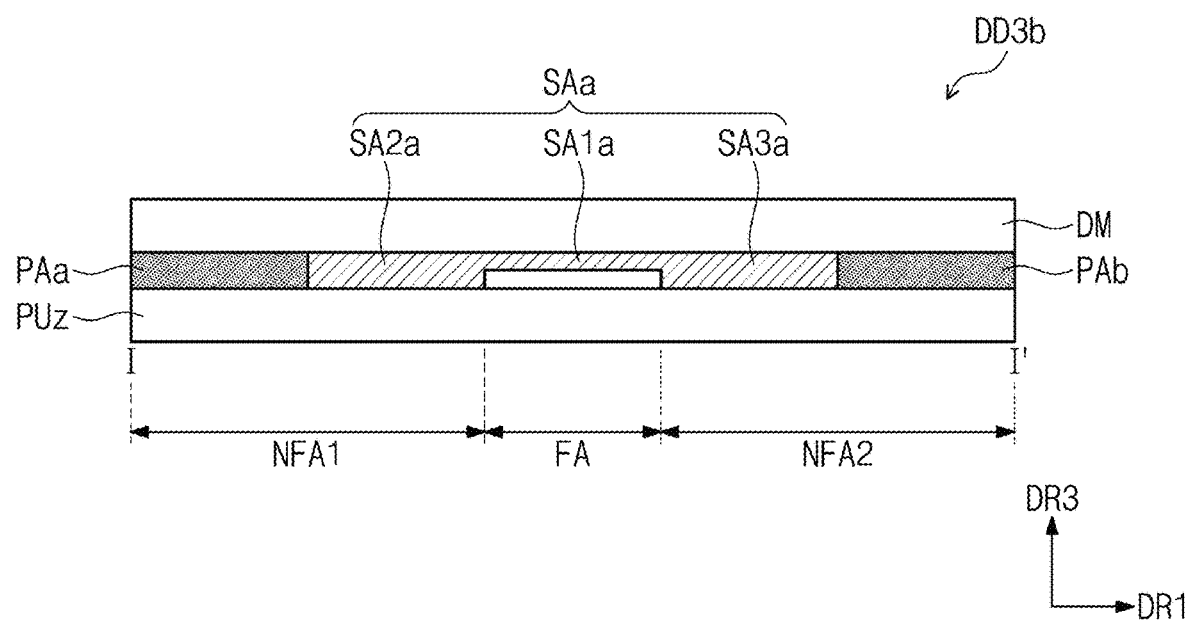
FIG. 10B is a cross-sectional view illustrating another exemplary embodiment of a display device according to the invention.

FIG. 9 is a cross-sectional view illustrating another exemplary embodiment of a folded display device according to the invention. FIG. 10A is a cross-sectional view illustrating another exemplary embodiment of a display device according to the invention. FIG. 10B is a cross-sectional view illustrating another exemplary embodiment of a display device according to the invention.

A display device DD3 in FIG. 9 may have substantially the same configuration as that of the display device DD in FIG. 3 except for a protection member. Thus, for convenience of description, the protection member will be mainly described, and description for the rest components will be omitted.

Referring to FIG. 9, a protection member PUz may be disposed on each of a folding area FA of a display module DM, a first non-folding area NFA1, and a second non-folding area NFA2. That is, the protection member PUz may be disposed over an entire bottom surface of the display module DM.

In an exemplary embodiment of the invention, the protection member PUz overlapping the folding area FA of the display module DM may be folded along the folding axis FX that is described in FIG. 1. Accordingly, the protection member PUz also may include a flexible material. In an exemplary embodiment, the protection member PUz may have an appropriate modulus value equal to or greater than about 500 MPa and equal to or less than about 1200 MPa to have all of flexibility for preventing a crack from being generated and impact resistance for protecting the folding area FA of the display module DM against an external impact, for example.

Referring to FIG.10A, a display device DD3a includes a reinforcing member SA having a constant thickness. The reinforcing member SA may include a central portion SA1, and a first portion SA2 and a second portion SA3, which are spaced apart from each other with the central portion SA1 therebetween.

The central portion SA1 may be disposed between a folding area FA of a display module DM and a protection member PUz to contact each of the folding area FA and the protection member PUz. The first portion SA2 may be disposed between a first non-folding area NFA1 of the display module DM and the protection member PUz to contact each of the first non-folding area NFA1, the protection member PUz, and a first adhesion portion PAa. The second portion SA3 may be disposed between a second non-folding area NFA2 of the display module DM and the protection member PUz to contact each of the second non-folding area NFA2, the protection member PUz, and a second adhesion portion PAb.

As described in FIG. 3, the reinforcing member SA may include a flexible material to have an appropriate modulus value equal to or greater than about 500 MPa and equal to or less than about 1200 MPa.

Referring to FIG. 10B, a display device DD3b includes a reinforcing member SAa in which a folding area FA and first and second non-folding areas NFA1 and NFA2 have different thicknesses from each other. The reinforcing member SAa in FIG. 10B may substantially have the same structure as the reinforcing member in FIG. 8A.

That is, a central portion SA1a may have a thickness less than that of each of a first portion SA2a and a second portion SA3a. The first portion SA2a and the second portion SA3a may have the same thickness as each other.

A first adhesion portion PAa contacts one area of a first non-folding area NFA1, a protection member PUz, and the first portion SA2a. The first adhesion portion PAa may have a top surface that is attached to the one area of the first non-folding area NFA1 and a bottom surface that is disposed on a top surface of the first protection plate PUz. The first portion SA2a may be attached to the first adhesion portion PAa through one side surface of the first adhesion portion PAa.

A second adhesion portion PAb contacts one area of a second non-folding area NFA2, the protection member PUz, and the second portion SA3a. The second adhesion portion PAb may have a top surface that is attached to one area of the second non-folding area NFA2 and a bottom surface that is disposed on a top surface of the protection member PUz. The second portion SA3a may be attached to the second adhesion portion PAb through one side surface of the second adhesion portion PAb.

As described above, the central portion SA1a may have a thickness less than that of each of the first portion SA2a and the second portion SA3a. As a result, when the display device DD3b is folded, a stress in the folding area FA may be further reduced.

Figure 11:
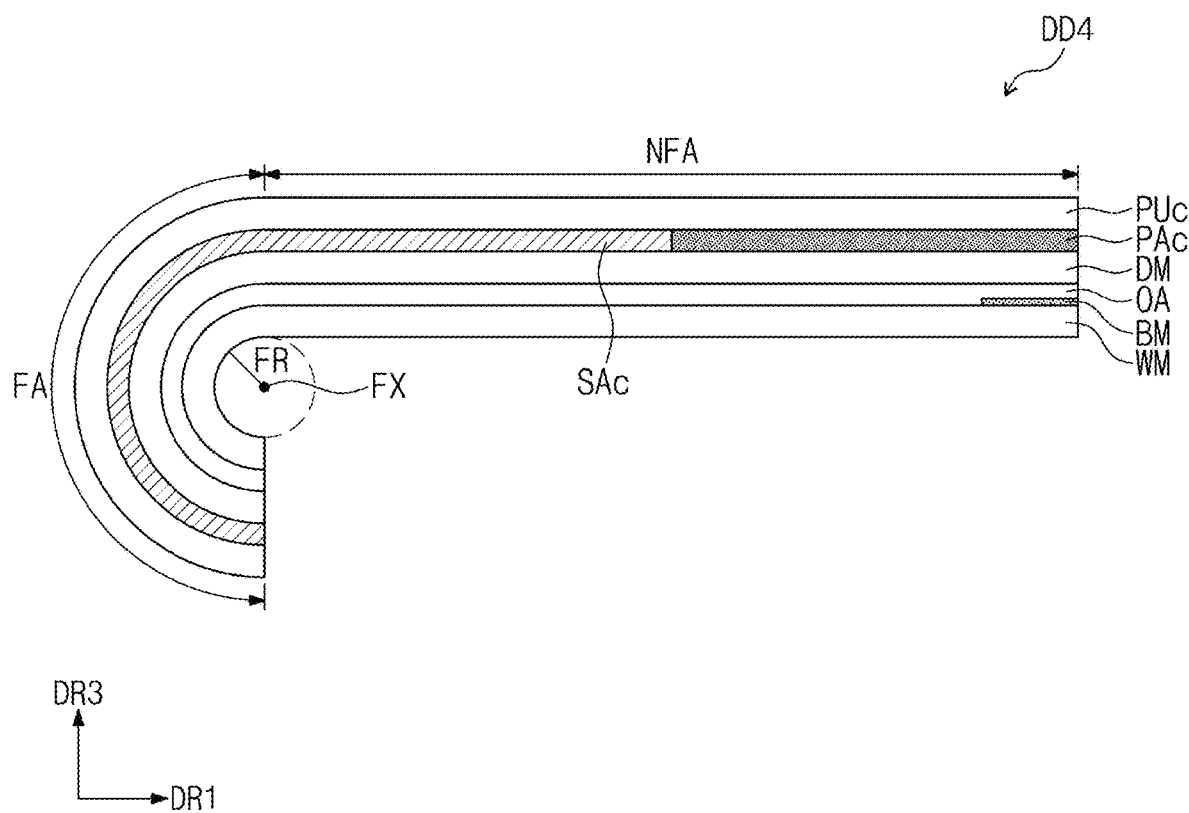
FIG. 11 is a cross-sectional view illustrating another exemplary embodiment of a folded display device according to the invention.

FIG. 11 is a cross-sectional view illustrating another exemplary embodiment of a folded display device according to the invention.

A display device DD4 in FIG. 11 may have substantially the same structure as that of the display device DD in FIG. 3 except that the second non-folding area NFA2 is omitted.

The display device DD4 includes a display module DM, a protection member PUc, a first adhesion member PAc, a reinforcing member Sac, a second adhesion member OA, and a window member WM.

That is, the display device DD4 may include a folding area FA that is folded along a folding axis FX and a non-folding area NFA that extends from the folding area FA. The display module DM may display an image through each of the folding area FA and the non-folding area NFA.

Also, an exemplary embodiment of the reinforcing member SAc according to the invention may be applied to one of the reinforcing members in the exemplary embodiments that are described above.

In the exemplary embodiment of the invention, the separate spaced space is not defined between the adhesion member and the reinforcing member, which are disposed between the display module and the protection member. As a result, the phenomenon in which the shape of the stepped portion is seen from the outside due to the spaced space between the reinforcing member and the adhesion member may be prevented.

Also, the reinforcing member in the exemplary embodiment of the invention may have all of the flexibility for preventing a crack from being generated and the impact resistance for protecting the folding area against an external impact.

Hereinabove, the exemplary embodiment is disclosed in the drawings and the specification. While specific terms were used, they were not used to limit the meaning or the scope of the invention described in claims, but merely used to explain the invention. Accordingly, a person having ordinary skill in the art will understand from the above that various modifications and other equivalent embodiments are also possible. Hence, the real protective scope of the invention shall be determined by the technical scope of the accompanying claims.

What is claimed is:

1. A foldable display device comprising:
   a display module comprising a folding area, which is folded with respect to a folding axis, and a first non-folding area and a second non-folding area, which are spaced apart from each other with the folding area therebetween;
   a protection member comprising a first protection plate disposed on the first non-folding area and a second protection plate disposed on the second non-folding area;
   an adhesion member comprising a first adhesion portion disposed between the first non-folding area and the first protection plate and a second adhesion portion disposed between the second non-folding area and the second protection plate; and
   a reinforcing member disposed on an entire area of the folding area and provided in a same layer as the first adhesion portion and the second adhesion portion,
   wherein the reinforcing member contacts each of the first adhesion portion and the second adhesion portion, and
   at least a portion of the reinforcing member has a thickness less than at least one of the first adhesion portion and the second adhesion portion so that an empty space which exposes a first surface of the reinforcing member opposite to a second surface of the reinforcing member facing the display module is defined in the folding area.

2. The foldable display device of claim 1, wherein the thickness of the reinforcing member is constant.

3. The foldable display device of claim 1, wherein the reinforcing member comprises at least one of an acrylic-based polymer, a silicon-based polymer, and an imide-based polymer.

4. The foldable display device of claim 1, wherein the first adhesion portion is disposed on a first area of the first non-folding area, and the second adhesion portion is disposed on a first area of the second non-folding area.

5. The foldable display device of claim 4, wherein the reinforcing member comprises:
   a central portion disposed on the folding area;
   a first portion disposed between a second area of the first non-folding area and the first protection plate; and
   a second portion disposed between a second area of the second non-folding area and the second protection plate.

6. The foldable display device of claim 5, wherein the first adhesion portion contacts the first area of the first non-folding area, the first protection plate, and the first portion, and
   the second adhesion portion contacts the first area of the second non-folding area, the second protection plate, and the second portion.

7. The foldable display device of claim 5, wherein when the display module is folded along the folding axis, the first portion and the second portion face each other in a thickness direction of the display module.

8. The foldable display device of claim 5, wherein the central portion has a thickness less than that of each of the first portion and the second portion.

9. The foldable display device of claim 8, wherein the first portion and the second portion have the same thickness as each other.

10. The foldable display device of claim 5, wherein the first portion and the first adhesion portion have the same thickness as each other and the second portion and the second adhesion portion have the same thickness as each other.

11. The foldable display device of claim 1, wherein the reinforcing member does not overlap each of the first non-folding area and the second non-folding area.

12. The foldable display device of claim 11, wherein the thickness of the reinforcing member is less than that of each of the first adhesion portion and the second adhesion portion.

13. The foldable display device of claim 1, wherein the reinforcing member has a modulus equal to or greater than 500 megapascals and equal to or less than 1200 megapascals.

14. The foldable display device of claim 1, wherein the display module comprises:
a display panel disposed on the protection member and the reinforcing member through the adhesion member; and
an input sensing unit disposed on the display panel.

15. A foldable display device comprising:
a display module comprising a folding area, which is folded with respect to a folding axis, and a first non-folding area and a second non-folding area, which are spaced apart from each other with the folding area therebetween;
a protection member disposed on the display module;
an adhesion member comprising a first adhesion portion disposed between a first area of the first non-folding area and the protection member and a second adhesion portion disposed between a first area of the second non-folding area and the protection member; and
a reinforcing member disposed on the folding area and provided in a same layer as the first adhesion portion and the second adhesion portion,
wherein the reinforcing member contacts each of the first adhesion portion and the second adhesion portion, and
at least a portion of the reinforcing member has a thickness less than at least one of the first adhesion portion and the second adhesion portion so that an empty space which exposes a first surface of the reinforcing member opposite to a second surface of the reinforcing member facing the display module is defined in the folding area.

16. The foldable display device of claim 15, wherein the reinforcing member comprises:
a central portion disposed between the folding area and the protection member;
a first portion disposed between a second area of the first non-folding area and the protection member; and
a second portion disposed between a second area of the second non-folding area and the protection member, and
the central portion, the first portion, and the second portion are unitary with each other.

17. The foldable display device of claim 16, wherein the central portion has a thickness less than that of each of the first portion and the second portion.

18. The foldable display device of claim 16, wherein the first adhesion portion contacts the display module, the protection member, and the first portion, and
the second adhesion portion contacts the display module, the protection member, and the second portion.

19. The foldable display device of claim 15, wherein the reinforcing member includes a flexible material.

20. A foldable display device comprising:
a display module comprising a folding area, which is folded with respect to a folding axis, and a non-folding area, which is disposed adjacent to the folding area;
a protection member disposed on the non-folding area;
an adhesion member disposed between the non-folding area and the protection member; and
a reinforcing member disposed on the folding area and provided in a same layer as the adhesion member,
wherein the reinforcing member contacts the adhesion member, and
at least a portion of the reinforcing member has a thickness less than that of the adhesion portion so that an empty space which exposes a first surface of the reinforcing member opposite to a second surface of the reinforcing member facing the display module is defined in the folding area.

* * * * *